US005828755A

United States Patent [19]

Feremans et al.

[11] Patent Number: 5,828,755

[45] Date of Patent: Oct. 27, 1998

[54] METHOD AND DEVICE FOR PROCESSING SIGNALS

[76] Inventors: Eric Edmond Feremans, Wandelingstraat 23-2A, B-8500 Kortrijk; Francis De Smet, Generaal Lemanlaan 151, B-8310 Brugge, both of Belgium

[21] Appl. No.: 750,110

[22] PCT Filed: Mar. 28, 1995

[86] PCT No.: PCT/BE95/00028

§ 371 Date: Nov. 26, 1996

§ 102(e) Date: Nov. 26, 1996

[87] PCT Pub. No.: WO96/31085

PCT Pub. Date: Oct. 3, 1996

[51] Int. Cl.[6] ..................... H03G 3/00

[52] U.S. Cl. ..................... 381/61; 381/98

[58] Field of Search ..................... 381/98, 101, 102, 381/103, 61

[56] References Cited

U.S. PATENT DOCUMENTS

| | | | |
|---|---|---|---|
| 4,700,390 | 10/1987 | Machida | 381/61 |
| 5,388,159 | 2/1995 | Sakata | 381/61 |

*Primary Examiner*—Forester W. Isen

*Attorney, Agent, or Firm*—Bacon & Thomas, PLLC

[57] ABSTRACT

A method is set forth for processing signals, in particular for treating audio signal, characterized in that it mainly consists in the supply of an input signal (3) to be treated; in the isolation of a number of signals (5) from the input signal (3) which are mainly situated in a predetermined part of the sound range; in the additional generation of higher harmonics on the basis of the isolated signals (5); and in the formation of an output signal (9) by combining the signal (7) which contains the generated higher harmonics with at least part of the above-mentioned input signal (3), this input signal (3) is either treat or not treated before being combined.

19 Claims, 1 Drawing Sheet

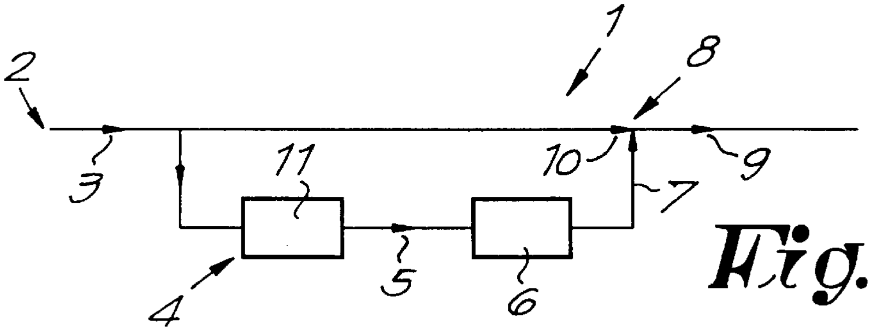
Fig.1
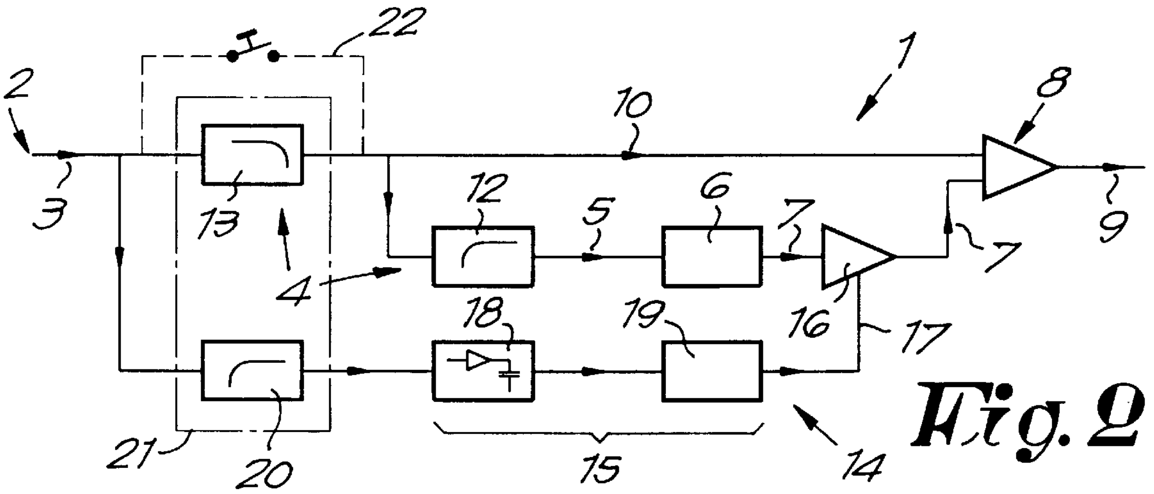
Fig.2
Fig.3
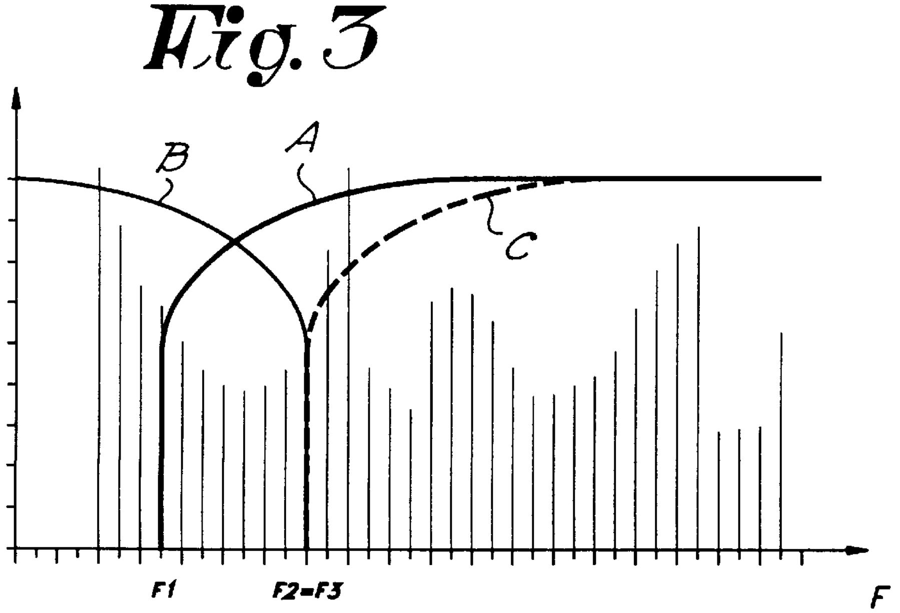

METHOD AND DEVICE FOR PROCESSING SIGNALS

FIELD OF THE INVENTION

The present invention concerns a method and device for processing signals.

In particular, it concerns a method and device for processing audio signals, particularly in order to improve the sound quality and/or to create special effects.

BACKGROUND OF THE INVENTION

It is known that audio signals can be subject to different types of interferences. An important type of interference hereby is noise. Moreover, various other types of interferences may occur such as distortions which have a negative effect on the sound clarity.

SUMMARY OF THE INVENTION

The present invention concerns a method and device for processing signals which makes it possible to significantly improve the sound quality of audio signals, irrespective of the source of the signal to be improved.

To this end, the invention concerns a method for processing signals, in particular for treating audio signals, characterized in that it mainly consists in the supply of an input signal to be treated; in the isolation of a number of signals from the input signal which are mainly situated in a predetermined part of the sound range; in the additional generation of higher harmonics on the basis of the isolated signals; and in the formation of an output signal by combining the generated higher harmonics with at least part of the above-mentioned input signal, whereby this input signal was treated or not treated before being combined.

According to a preferred embodiment, in order to produce the isolated signal, on the basis of which the higher harmonics are generated, the tones which exceed a certain value are isolated and transmitted. The pass limit, in other words the frequency for which the tones are allowed to pass, is preferably situated between 3,000 and 5,000 Hz, and better still at about 3,500 Hz.

Moreover, it is preferable that only those tones which are situated under a certain value are isolated, in other words that the tones which are situated above this value are eliminated or at least considerably abated. The pass limit, in this case the limit above which the tones are eliminated or considerably abated, is preferably situated between 4,000 and 19,000 Hz and better still at about 7,000 Hz.

According to a special embodiment of the method according to the invention, the input signal is treated before being combined with the signal which consists of the additionally generated higher harmonics. This treatment may consist in that the tones within a certain range also eliminated and/or abated. Preferably, only tones below a certain pass limit are let through, whereby this pass limit is preferably situated at about 7,000 Hz.

Also, according to the most preferred embodiment, the higher harmonics are generated on the basis of the signals of only a restricted band of the sound range, namely those included between 3,500 and 7,000 Hz.

The combination of the signal which produces the additionally generated higher harmonics with the input signal which was either treat or not treated, in order to provide for the above-mentioned end signal, is preferably realized by supplying both signals to an adder amplifier.

According to yet another special embodiment, in order to optimize the aimed effect, an additional control is preferably provided, this additional control consists in that the passage of the additional higher harmonics is regulated as a function of the input signal, or at least as a function of the intensity of this input signal. This control preferably makes it possible for the signal of the additionally generated higher harmonics to be more or less amplified as a function of the input signal.

Depending on the desired effect, different methods can be used with this control. Preferably, the input signal, or at least part thereof, is transformed into a control signal which provides a required amplification for the signal with the additionally generated higher harmonics. This control signal can be obtained by rectifying the above-mentioned input signal, or a part thereof, and subsequently transforming it into a typical control signal for an amplifier.

The above-mentioned transformation may be carried out according to a mathematical function. Preferably, a linear transformation is provided for.

The above-mentioned control signal does not necessarily have to be based on the entire input signal. Preferably, this control signal is even derived from merely a part of the input signal, such as a part situated within a certain range. Preferably, the control signal is derived and/or calculated as a function of the full package of higher tones present in the input signal to be treated, such as the tones above a certain pass limit, preferably situated between 6,000 and 8,000 Hz, and better still at 7,000 Hz. The present invention also concerns a device to realize the above-mentioned method.

BRIEF DESCRIPTION OF THE DRAWING FIGURES

In order to better explain the characteristics according to the invention, the following preferred embodiments of the invention, in particular of devices according to the invention, are given as an example only without being limitative in any way, with reference to the accompanying figures, where:

FIG. 1 represents a device according to the invention in a block diagram;

FIG. 2 represents another device according to the invention in a block diagram;

FIG. 3 represents a diagram which is related to the operation of the device in FIG. 2.

DESCRIPTION OF THE INVENTION

As represented in FIG. 1, the invention concerns a device 1 for processing audio signals, in particular for improving and/or altering the quality of the sound which results from such signals.

As is also represented in FIG. 1, the device mainly consists of an entry 2 for the supply of an input signal 3 to be improved and/or altered; means 4 to isolate a number of signals 5 from the input signal 3 which are mainly situated in a specific part of the sound range; means 6 for the additional generation of higher harmonics on the basis of the isolated signals 5, hereafter called signal 7; and means 8 for the formation of an output signal 9 which provide for the combination of the generated higher harmonics, in other words the signal 7, with a signal 10 which is either identical to the input signal 3, or, as will be described hereafter, forms part of the signal 2, provide or not in a further treated shape.

The means 4 to isolate a number of signals 5 which are mainly situated in a specific part of the sound range from the input signal 3, consist of a selective element 11 which lets tones within a certain range pass and which eliminates or at least abates the other tones. In preference, a selective circuit is used to this end which eliminates and/or abates at least the lower tones and lets the higher tones pass or lets them pass for the main part, such as for example a high-pass filter or an adjustable selective filter.

In order to obtain an even better effect, the selective element 11 is not only made such that only the lower tones under a certain first pass limit are eliminated and/or abated, but also the higher tones above a second pass limit, whose cutting-off frequency is higher than that of the first pass limit, are eliminated and/or abated.

The values of the above-mentioned pass limits will be further elucidated in the description of FIGS. 2 and 3.

The means 6 for the additional generation of higher harmonics on the basis of the isolated signals 5 may consist of a harmonics such as described in Belgian patent No. 1004054.

The above-mentioned means 8 for the formation of the output signal 9 on the basis of the above-mentioned signals 7 and 10 may be of a different nature. In the example given in FIG. 1, they merely consist of a coupling between the input 2 and the output of the means 6, which implies that the signal 7 is superposed on the input signal 3, which subsequently results in the above-mentioned output signal 9.

FIG. 2 represents a further developed embodiment.

The above-mentioned means 4 consist in this case of two elements of electronic parts 12 and 13.

The element 12 consists of a circuit which eliminates and/or abates the tones under a certain pass limit F1, such as a high-pass filter. The value F1 is preferably situated between 3,000 and 5,000 Hz. In particular, this value F1 preferably amounts to 3,500 Hz, as represented by means of the curve A in FIG. 3. This curve A shows that most tones in the higher range are allowed to pass.

The element 13 consists of a circuit which eliminates and/or abates the tones above a certain pass limit F2, such as a low-pass filter. The value F2 is preferably situated between 6,000 and 19,000 Hz. In particular, this value F2 preferably amounts to 7,000 Hz, as represented by means of the curve B in FIG. 3. This curve B shows that tones in the lower range are mostly allowed to pass.

The above-mentioned means 6 are of the same nature as in FIG. 1.

In the embodiment of FIG. 2, the means 8 consist of an adder amplifier.

As already described in the elucidation of the method, the input signal 3 can be treated first before being supplied, in the shape of a signal 10, to the means 8, in this case the adder amplifier. The treatment preferably consists in that only certain tones are allowed to pass.

In order to reach optimum results with the improvement of existing signals, a circuit is used to this end which eliminates and/or abates the tones above a certain pass limit F3, such as a low-pass filter. The pass limit F3 is preferably situated at 7,000 Hz. In the example represented in FIG. 2, no separate circuit is used to this end, but the element 13 of the device is also used to this end.

In order to further optimize the aimed effect, the device 1 is preferably also provided with an additional control 14, which regulates the transmission of the additionally generated higher harmonics or in other words the signal 7 as a function of certain characteristics of the input signal 3. Preferably, the control 14 makes sure that the signal 7 is amplified to a greater or lesser extent, as a function of the supplied input signal 3 or as a function of a part of this signal, whereby the general intensity of the input signal 3 or of the above-mentioned part thereof is used as a measure for the amplification.

Also, the control 14 mainly consists of a conversion circuit 15 and an adjustable amplifier 16, whereby the amplifier 16 provides for the amplification of the above-mentioned signal 7 and whereby the conversion circuit 15 delivers a control signal 17 which provides for the control of the amplifier 16.

The conversion circuit 15 preferably consists of a rectifier 18 and a transformation circuit 19. The transformation circuit 19 in its turn preferably consists of a linear transformer connection. However, the transformation circuit 19 may also consist of another connection which provides for a transformation according to a mathematical function determined by the designer. According to yet another special embodiment, the transformation circuit 19 is equipped with a threshold connection.

In order to further optimize the aimed effect, only part of the input signal 3 is transmitted to the conversion circuit 15 by making use of a selective element 20 which lets through only the tones above a certain pass limit. This pass limit preferably has a value between about 6,000 and 8,000 Hz, and better still of 7,000 Hz. Use can be made to this end of a high-pass filter. The working of the selective element 20 is represented in FIG. 3 by means of a curve C.

The above-mentioned part 13 and the selective element 20 may possibly be integrated in one adjustable filter 21.

According to yet another variant, a circuit 22 can be provided to short-circuit the above-mentioned element 13, such that this element 13, if required, can be switched off.

The working of the device 1 can be easily derived from FIG. 2 and the previous description.

The original audio signal is supplied as input signal 3 to the input of the device 1. This input signal is stripped of part of the top harmonics through the selective operation of the element 13 of the device 1. The resulting signal is led to the element 12, which, as mentioned above, preferably consists of a high-pass filter, which lets part of the remaining harmonics through.

The remaining signal is supplied to the harmonic generator 6, which adds high harmonics to the signal.

The obtained signal 7 is supplied to the adjustable amplifier 16 which in turn transmits an amplified signal to the second input of the adder amplifier 8.

The control voltage of the adjustable amplifier 16 is derived from the input signal 3. To this end, this input signal 3 is supplied to the selective element 20, in this case a high-pass filter which determines whether there are any harmonic components as of the set frequency and transmits them to the conversion circuit 15 which delivers a control signal 17 in the shape of an output voltage as a function of the signal after the rectifier 18, whereby different settings are possible. As mentioned above, a threshold voltage can hereby be set, but also other linear, non-linear and complex relations between the input signal and the output signal of the transformation circuit 19 are possible, such to make an optimum acoustic setting possible.

Thanks to the device 1, the noise of the audio signal is less disturbing and/or the sound is broadened in the audible spectrum.

It should be noted that the method as well as the device 1 reduce the signal/noise relation of audio signals, irrespective of the type of source. Taking into account the psychoacoustic data, the sound is brightened, in particular provided with extra dominant tones.

It is clear that in this description, by "tones" should usually be understood the electric signals corresponding to these tones.

The device 1 can be made in analog form as well as digital.

The present invention is by no means limited to the embodiments described by way of example and represented in the figures; on the contrary, such a method and device for processing signals can be made in all sorts of variants while still remaining within the scope of the invention as defined in the accompanying claims.

We claim:

1. A method for processing audio signals to adjust quality of sounds produced comprising:

(a) supplying input signals to be treated;

(b) isolating a set of basis signals from said input signals, said set of basis signals lying exclusively within at least one frequency range;

(c) generating higher harmonic signals representative of higher harmonics of said set of basis signals; and (d) forming output signals by combining the higher harmonic signals with at least part of said input signals, wherein said step of combining the generated higher harmonic signals with at least part of said input signals is controlled at least as a function of signals extracted from said input signals, said extracted signals lying at least in part within a frequency range outside said at least one frequency range.

2. A method according to claim 1, wherein said isolated set of basis signals are pass filtered in a first predetermined range such that signals above a given limit can pass before generating said higher harmonics.

3. A method according to claim 2, wherein said first predetermined range has a lower value of between 3000 and 5000 Hz.

4. A method according to claim 3, wherein said lower value is 3500 Hz.

5. A method according to claim 2, wherein said isolated set of basis signals, before or after being isolated, are also pass filtered in a second predetermined range different from said first predetermined range, said first and second predetermined ranges partially overlapping; and wherein isolated signals above a given value are eliminated or at least abated.

6. A method according to claim 5, wherein said given value is between 4000 and 19000 Hz.

7. A method according to claim 6, wherein said given value is 7000 Hz.

8. A method according to claim 1, wherein at least a part of said input signals are changed before being combined with said generated higher harmonic signals to form said output signals, the change including eliminating part of said input signals within a selected range.

9. A method according to claim 8, wherein said change includes pass filtering said input signals only below a given limit.

10. A method according to claim 9, wherein said given limit is about 7000 Hz.

11. A method according to claim 6, wherein at least a part of said input signals are changed before being combined with said generated higher harmonic signals to form said output signals, the change including eliminating part of said input signals within a selected range, wherein said change includes pass filtering said input signals only below a given limit, and wherein said given limit is the same value as said given value of said second predetermined range.

12. A method according to claim 1, wherein the step of combining the generated higher harmonic signals with at least part of said input signals is controlled by amplifying said generated higher harmonic signals as a function of said extracted signals.

13. A method according to claim 1, wherein the step of combining the generated higher harmonic signals with at least part of said input signals is carried out by forming a control signal from at least a part of said extracted signals, by rectifying said at least part of said extracted signals, and subsequently by transforming said at least part of said extracted signals into said control signal.

14. A method according to claim 13, wherein said step of transforming said at least part of said extracted signals is carried out by a predetermined mathematical function.

15. A method according to claim 13, wherein said step of transforming said at least part of said extracted signals is carried out by a linear transformation.

16. A method according to claim 1, wherein said at least part of said extracted signals for achieving control of said step of combining is formed by pass filtering said at least part of said input signals above a given limit.

17. A method according to claim 16, wherein said given limit is about 7000 Hz.

18. A method according to claim 1, wherein all of said input signals are combined with said generated higher harmonic signals to form said output signal.

19. A device for processing audio signals to adjust quality of sounds produced comprising:

(a) means for supplying input signals to be treated;

(b) means for isolating a set of basis signals from said input signals, said set of basis signals lying exclusively within at least one frequency range;

(c) means for generating higher harmonics of said set of signals; and (d) means for forming output signals by combining the higher harmonic signals with at least part of said input signals, wherein said means for forming output signals by combining the higher harmonic signals with at least part of said input signals includes means for controlling formation of the output signals at least as a function of signals extracted from said input signals, said extracted signals lying at least in part within a frequency range outside said at least one frequency range.

* * * * *